United States Patent [19]
Lin et al.

[11] Patent Number: 6,069,061
[45] Date of Patent: May 30, 2000

[54] METHOD FOR FORMING POLYSILICON GATE

[75] Inventors: Tony Lin, Kaohsiung Hsien; Water Lur, Taipei, both of Taiwan

[73] Assignee: United Microelectronics Corp., Hsinchu, Taiwan

[21] Appl. No.: 09/245,648

[22] Filed: Feb. 8, 1999

[51] Int. Cl.$^7$ .......................... H01L 21/28; H01L 21/336
[52] U.S. Cl. .......................... 438/517; 438/532; 438/593
[58] Field of Search .................... 438/257, 593, 438/532, 517, 491, 591, 657, 659

[56] References Cited

U.S. PATENT DOCUMENTS

| | | | |
|---|---|---|---|
| 4,697,333 | 10/1987 | Nakahara | 437/20 |
| 5,147,813 | 9/1992 | Woo | 437/43 |
| 5,441,904 | 8/1995 | Kim et al. | 437/40 |
| 5,652,156 | 7/1997 | Liao et al. | 437/40 |
| 5,736,442 | 4/1998 | Mori | 438/257 |

*Primary Examiner*—George Fourson
*Assistant Examiner*—Elizabeth Abbott
*Attorney, Agent, or Firm*—Thomas, Kayden, Horstemeyer & Risley

[57] ABSTRACT

A method is provided for forming a polysilicon gate. A stacked gate with a first polysilicon layer/an oxide layer/a second polysilicon layer multiple structure is formed. The invention provides another method for forming a polysilicon gate, in which a first polysilicon layer is formed and waits for a period of time. Then, a second polysilicon layer is formed on the first polysilicon layer. A grain boundary is formed between the first polysilicon layer and the second polysilicon layer. The invention provides still another method for forming a polysilicon gate, in which a polysilicon layer is formed at the temperature of about 600-700° C. and the pressure of about 1–5 torr to form a small-grained polysilicon layer. The three methods for forming a polysilicon gate can prevent the heavy ions from passing through the polysilicon gate and the gate oxide layer into the substrate while performing a pre-amorphization implant process. The absence of these heavy ions in the substrate avoids the subthreshold kink side-effect.

7 Claims, 8 Drawing Sheets

METHOD FOR FORMING POLYSILICON GATE

BACKGROUND OF THE INVENTION

1. Field of the Invention

The present invention relates to a method for forming a semiconductor device. More particularly, the present invention relates to a method for forming a polysilicon gate.

2. Description of the Related Art

When integration of elements in integrated circuits (IC) increases, line widths and geometries for semiconductor devices are reduced. However, source/drain region resistances in metal oxide semiconductor (MOS) transistors simultaneously increase, and the polysilicon electrodes that form the MOS gates and wiring lines within semiconductor devices become undesirably resistive. As the resistance of the source/drain region is almost the same as the resistance of a channel in the MOS transistor, a process of self-aligned silicide (salicide) is employed to reduce the sheet resistance of the source/drain regions in order to preserve the integrity of shallow junctions between the metal layer and the MOS transistor. The salicide process is currently used in a manufacturing process of very large scale integration (VLSI) and ultra large scale integration (ULSI) device. Multilayer electrodes in which a layer of polysilicon is covered by one or more layers of metals or metal silicides are used to provide good conductivity, which improves the electrical performance of the MOS gate and the wiring line.

As the dimension of the gate becomes smaller, a narrow line effect is generated because the stress between the gate and the metal silicide layer is increased, and the nucleation site of the metal silicide layer is decreased. The quality of the metal silicide layer on the gate is thus degraded, or even an island-shaped metal silicide layer may be formed. As a consequence, the operation performance of the gate is affected.

A pre-amorphization implant (PAI) process is performed before the step of forming the silicide layer in order to reduce sheet resistance.

FIGS. 1A through 1C are schematic, cross-sectional views showing the progression of the conventional manufacturing steps for forming a self-aligned silicide.

Referring to FIG. 1A, a substrate 100 having an isolation structure 102 is provided, a gate oxide layer 104 and a polysilicon gate 106 are formed over the substrate 100, and source/drain regions 108 is formed in the substrate 100. An ion bombardment step with arsenic (As) ions is performed on the polysilicon gate 106 surface, wherein the dosage of the arsenic ions is about 1E14–1E15 ions/cm$^2$ and the energy of the arsenic ions is about 20–40 KeV. The ion bombardment step damages the polysilicon gate 106 surface to form an amorphous silicon layer 109. The grain size of the amorphous silicon layer 109 are smaller than those of the polysilicon gate 106. Therefore, the quality of a metal silicide layer on this polysilicon gate 106 is thus increased while a self-aligned silicide process is performed sequentially.

Referring to FIG. 1B, a metallic layer 110 is formed conformal to the substrate 100 by sputtering. The metallic layer 110 reacts with the silicon of the substrate 100 and the polysilicon gate 106 surface to form a silicide layer 112 by rapid thermal processing (RTP) on the polysilicon gate 106 surface and the source/drain regions 108 surface.

Referring to FIG. 1C, the unreacted metallic layer 110 is removed by wet etching.

FIG. 2 is a schematic, cross-sectional view showing a polysilicon gate during performance of a pre-amorphization implant process.

Referring to FIG. 2, arsenic ions 116 are implanted into the polysilicon gate. While performing a pre-amorphization implant process with arsenic ions 116, the arsenic ions 116 easily pass through the polysilicon gate 106 and the gate oxide layer 104 along interface 114 between polysilicon grains into the substrate 100 because the vacancy between poly grains is large and nothing is formed in the pathway of the arsenic ions 116 to stop them. As a result, NMOS subthreshold current is increased and a subthreshold kink side-effect occurs. The quality of a device is decreased because of the effect mentioned above.

SUMMARY OF THE INVENTION

Accordingly, the purpose of the present invention is to provide a method for forming a polysilicon gate. The method prevents the heavy ions from passing through the polysilicon gate and the gate oxide layer into the substrate while performing a pre-amorphization implant process, such that the subthreshold kink side-effect is avoided.

To achieve these and other advantages and in accordance with the purpose of the invention, as embodied and broadly described herein, the invention provides a method for forming a polysilicon gate. A stacked gate of polysilicon layer/oxide layer/polysilicon layer is formed. The stacked gate prevents the heavy ions from passing through the polysilicon gate and the gate oxide layer into the substrate while performing a pre-amorphization implant process, such that the subthreshold kink side-effect is avoided.

To achieve these and other advantages and in accordance with the purpose of the invention, as embodied and broadly described herein, the invention provides a method for forming a polysilicon gate. A first polysilicon layer is formed over a substrate, and a second polysilicon layer is formed on the first polysilicon layer. A grain boundary, which is the interface of the first polysilicon layer and the second polysilicon layer, is formed to prevent the heavy ions from passing through the polysilicon gate and the gate oxide layer into the substrate while performing a pre-amorphization implant process, so that the subthreshold kink side-effect is avoided.

To achieve these and other advantages and in accordance with the purpose of the invention, as embodied and broadly described herein, the invention provides a method for forming a polysilicon gate. A polysilicon layer is formed at a temperature of about 600–700° C., and the pressure is about 1–5 torr. The polysilicon layer prevents the heavy ions from passing through the polysilicon gate and the gate oxide layer into the substrate while performing a pre-amorphization implant process, so that the subthreshold kink side-effect is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
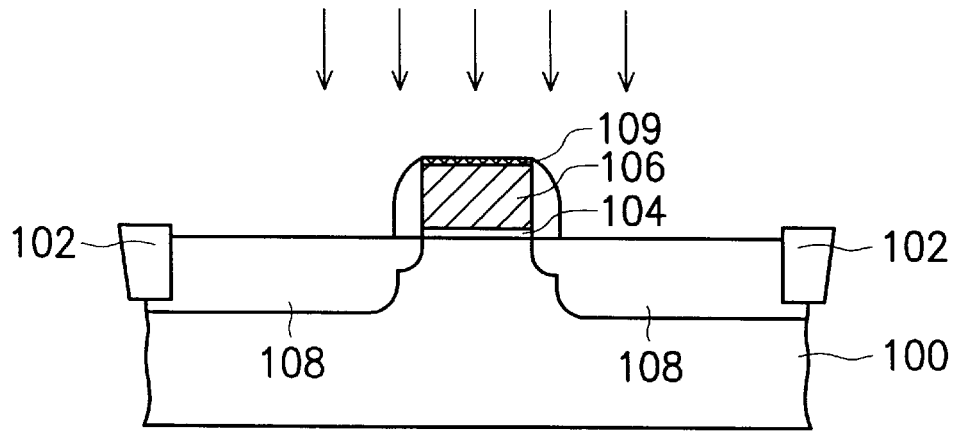
FIGS. 1A through 1C are schematic, cross-sectional views showing the progression of the conventional manufacturing steps for a self-aligned silicide.
Figure 1B:
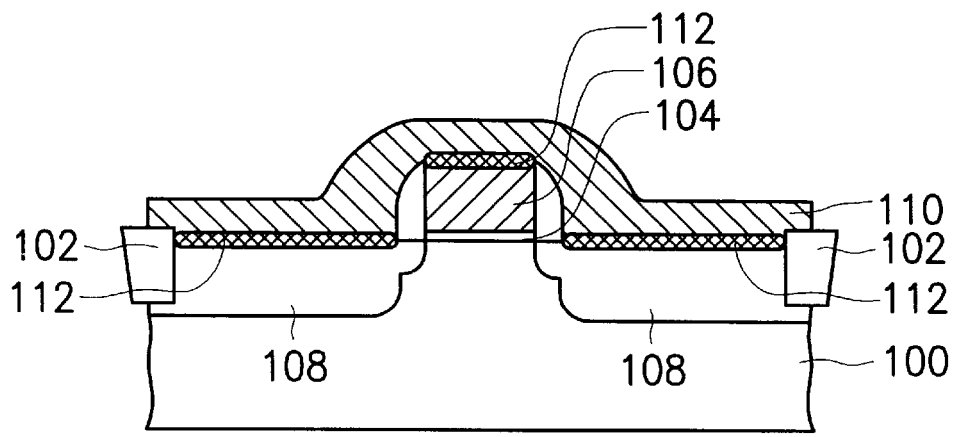
Figure 1C:
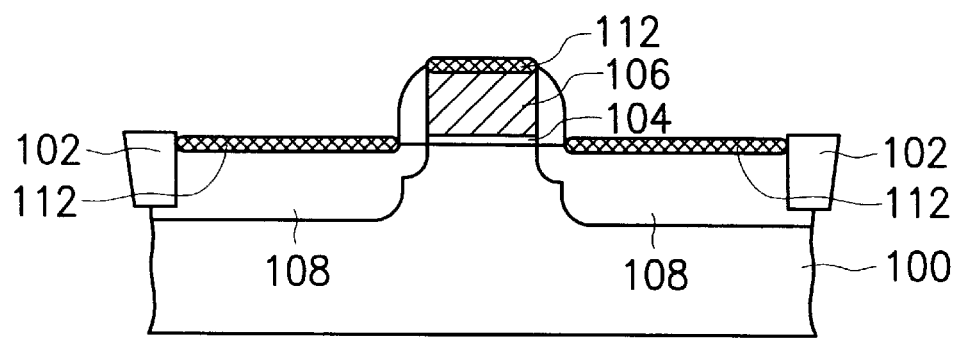
Figure 2:
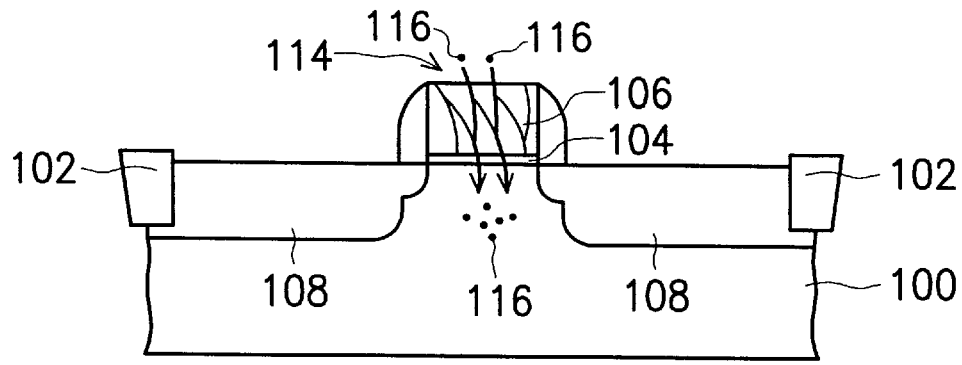
FIG. 2 is schematic, cross-sectional view showing a polysilicon gate formed conventionally while performing a pre-amorphization implant process.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are schematic, cross-sectional views showing the progression of the manufacturing steps for a polysilicon gate and a self-aligned silicide in accordance with the first preferred embodiment of the present invention.

Figure 3A:
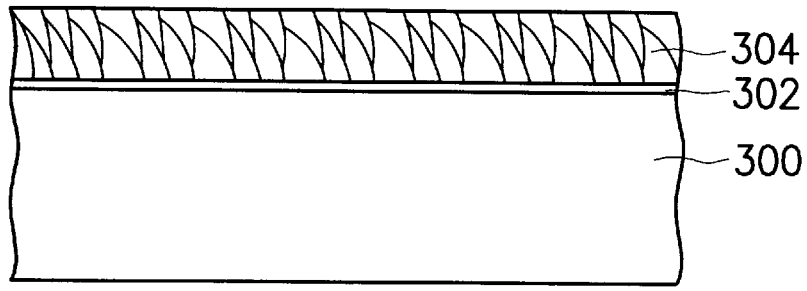
FIGS. 3A through 3E are schematic, cross-sectional views showing the progression of the manufacturing steps for a polysilicon gate and a self-aligned silicide in accordance with the first preferred embodiment of the present invention.

Referring to FIG. 3A, a substrate 300 is provided, and a gate oxide layer 302 is formed, for example, by thermal oxidation on the substrate 300. The thickness of the gate oxide layer 302 is about 30–60 Å. A first polysilicon layer 304 is formed, for example, by chemical vapor deposition (CVD) on the gate oxide layer 302. The thickness of the first polysilicon layer 304 is about 800–1200 Å. The first polysilicon layer 304 is preferably doped with ions such as phosphorus or boron to increase the conductivity.

Figure 3B:
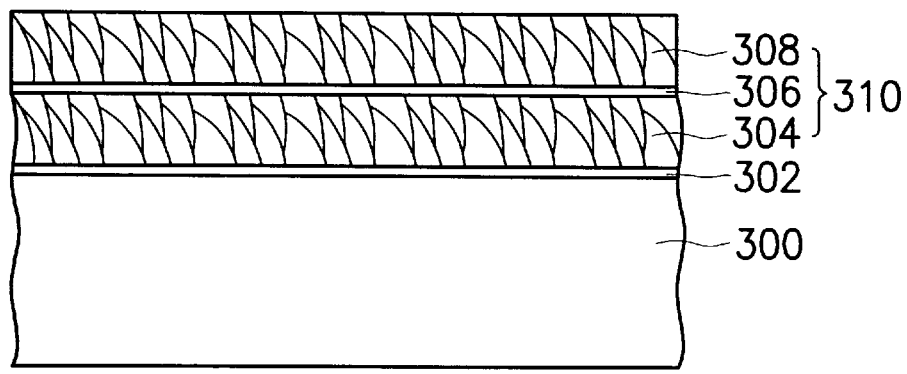

Referring to FIG. 3B, a native oxide layer 306 is formed on the first polysilicon layer 304. The thickness of the native oxide layer 306 is about 10–50 Å. A second polysilicon layer 308 is formed, for example, by chemical vapor deposition on the native oxide layer 306. The thickness of the second polysilicon layer 308 is about 500–900 Å. The second polysilicon layer 308 is preferably doped with ions such as phosphorus or boron to increase the conductivity. The first polysilicon layer 304, the native oxide layer 306 and the second polysilicon layer 308 comprise a stacked gate 310.

Figure 3C:
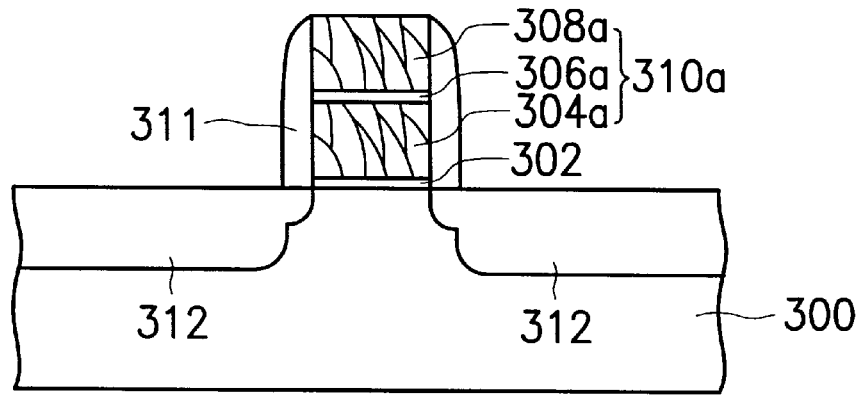

Referring to FIG. 3C, the stacked gate 310 is defined, for example, by photolithography and etching to form a gate 310a which is made of a first polysilicon layer 304a/a native oxide layer 306a/a second polysilicon layer 308a. A spacer 311 is formed on the gate 310a sidewalls, a source/drain regions 312 is formed in the substrate 300, and then a transistor according to the invention is complete. The technique of forming the transistor is not directly related to the invention and is well known to these skilled in the art, so that detailed description is omitted herein. In the following, a self-aligned silicide process is performed with the gate 310a formed in accordance with this preferred embodiment of the present invention.

Figure 3D:
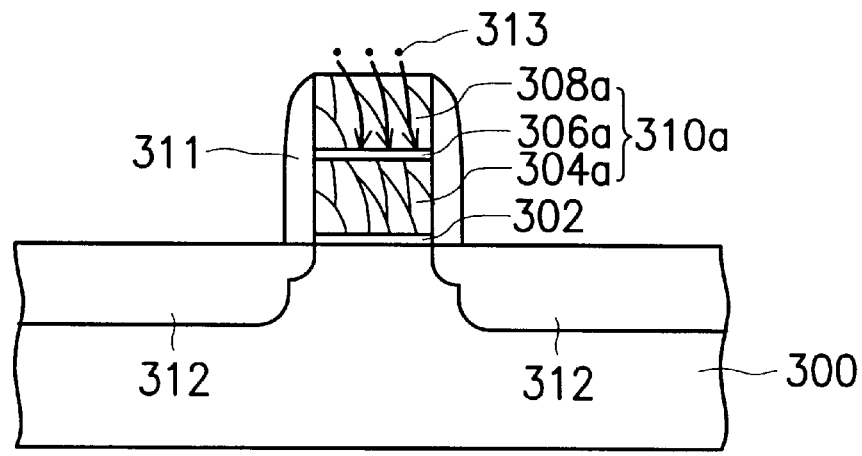

Referring to FIG. 3D, an ion bombardment step with heavy ions 313, such as arsenic ions, is performed on the polysilicon gate 310a surface, wherein the dosage of the arsenic ions is about 1E14–1E15 ions/cm² and the energy of the arsenic ions is about 20–40 KeV. The ion bombardment step damages the gate 310a surface to form an amorphous silicon layer. The grain size of the amorphous silicon layer are smaller than those of the polysilicon gate. The depth to which the arsenic ions 313 are implanted into the gate 310a is about 200–500 Å. The gate 310a is made of the first polysilicon layer 304a/the native oxide layer 306a/the second polysilicon layer 308a. The native oxide layer 306a is used as a stop layer which can prevent the arsenic ions 313 from passing through the polysilicon layer 304a and the gate oxide layer 302 into the substrate 300 while performing the pre-amorphization implant process; thus, the subthreshold current is not increased because there are no heavy ions in the substrate to create a current. The subthreshold kink side-effect is avoided because there are no heavy ions in the substrate to create the subthreshold current.

Figure 3E:
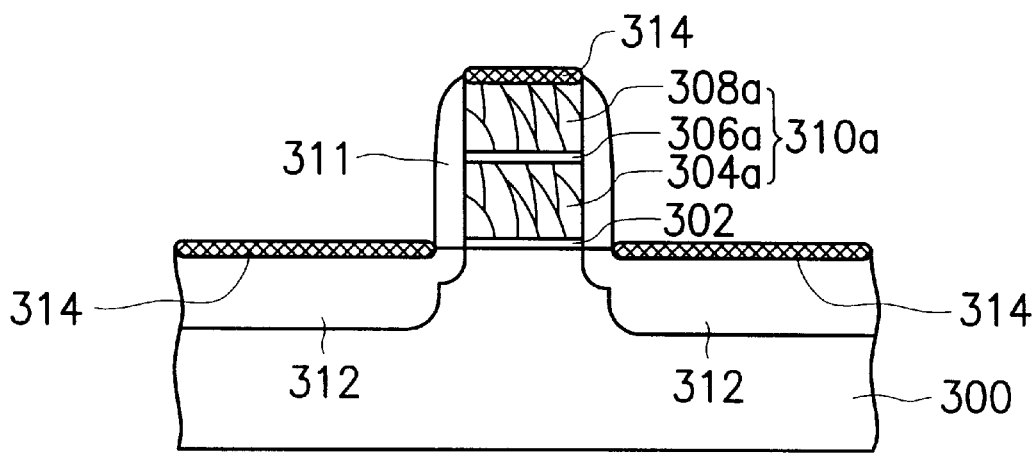

Referring to FIG. 3E, a conformal metallic layer (not shown) is deposited over the substrate 300 by, for example, sputtering. A portion of the metallic layer reacts with the silicon the gate 310a and the source/drain region 312 to form a silicide layer 314 by rapid thermal processing (RTP), for example. Then, the unreacted metallic layer is removed, for example, by wet etching.

FIGS. 4A through 4E are schematic, cross-sectional views showing the progression of the manufacturing steps for a polysilicon gate and a self-aligned silicide in accordance with the second preferred embodiment of the present invention.

Figure 4A:
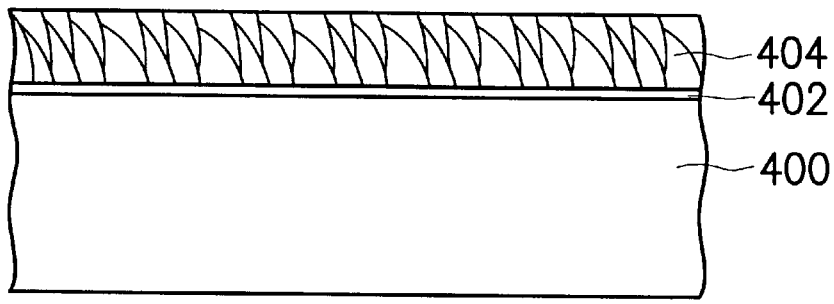
FIGS. 4A through 4E are schematic, cross-sectional views showing the progression of the manufacturing steps for a polysilicon gate and a self-aligned silicide in accordance with the second preferred embodiment of the present invention.

Referring to FIG. 4A, a substrate 400 is provided, and a gate oxide layer 402 is formed, for example, by thermal oxidation on the substrate 400. The thickness of the gate oxide layer 402 is about 30–60 Å. A first polysilicon layer 404 is formed, for example, by chemical vapor deposition (CVD) on the gate oxide layer 402. The thickness of the first polysilicon layer 404 is about 800–1200 Å. The first polysilicon layer 404 is preferably doped with ions such as phosphorus or boron to increase the conductivity.

Figure 4B:
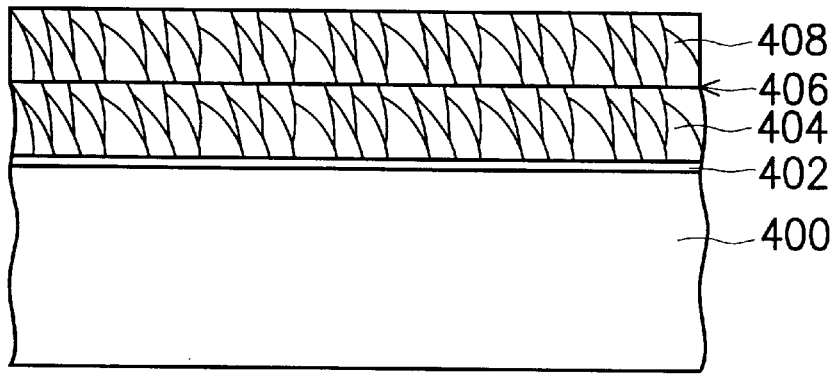

Referring to FIG. 4B, a second polysilicon layer 408 is formed, for example, by chemical vapor deposition on the first polysilicon layer 404. The thickness of the second polysilicon layer 408 is about 500–900 Å. The second polysilicon layer 408 is preferably doped with ions such as phosphorus or boron to increase the conductivity. The first polysilicon layer 404 and the second polysilicon layer 408 are formed separately. A grains boundary 406, which is the interface of the first polysilicon layer 404 and the second polysilicon layer 408, is formed because the lattice arrangement of the first polysilicon layer 404 is different to the second polysilicon layer 408.

The step of forming the first polysilicon layer 404 and the second polysilicon layer 408 includes the following steps. After the step of forming the first polysilicon layer 404, the reaction gas is turned off and the reaction condition mentioned above in the chamber is maintained. Then, after a short waiting period (about 10–60 seconds), the reaction gas is turned on to form the second polysilicon layer 408. As a result, the second polysilicon layer 408 serves as a new layer with similar grain size, but different grain boundaries due to the interface 406 between the first polysilicon layer 404 and the second polysilicon layer 408. The grains of two polysilicon layers 404 and 408 therefore are not aligned at the interface 406. This can effectively avoid a penetration of implanted ions later. In order to obtain a new layer of polysilicon, in accordance with the invention, the deposition process need only be interrupted for a period.

Figure 4C:
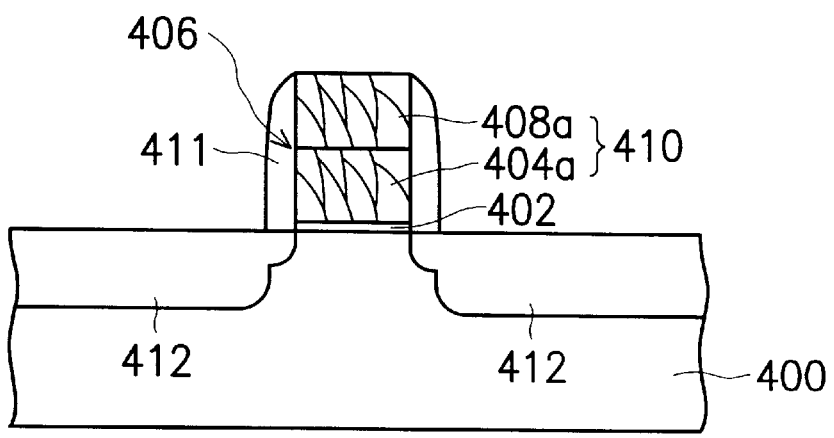

Referring to FIG. 4C, the first polysilicon layer 404 and the second polysilicon layer 408 are defined, for example, by photolithography and etching to form a gate 410 which comprises a first polysilicon layer 404a and a second polysilicon layer 408a. A spacer 411 is formed on the gate 410 sidewalls, source/drain regions 412 is formed in the substrate 400, and then a transistor according to the invention is complete. The technique of forming the transistor is not directly related to the invention and is well known to these skilled in the art, so that detailed description is omitted herein. In the following, a self-aligned silicide process is performed with the gate 410 formed in accordance with this preferred embodiment of the present invention.

Figure 4D:
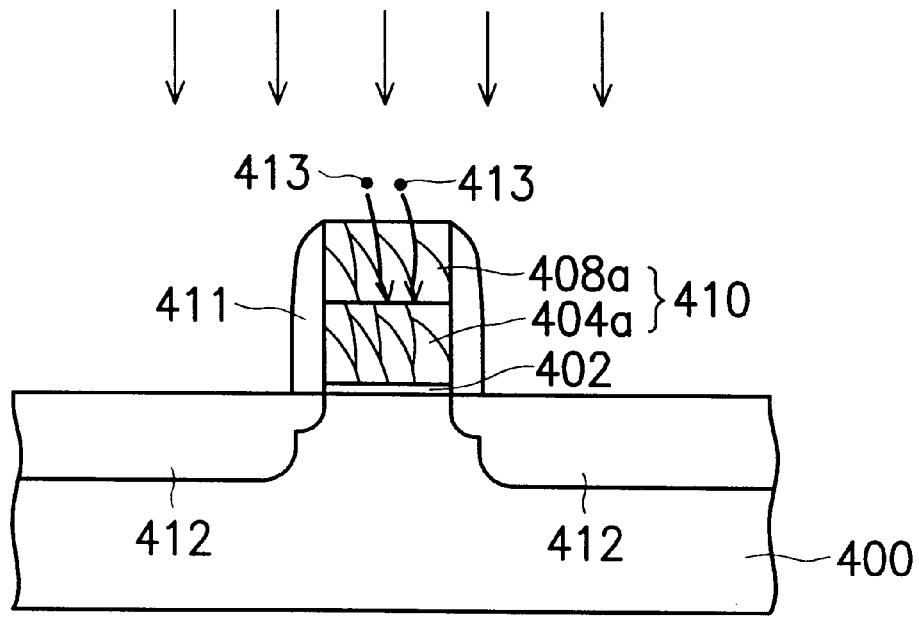

Referring to FIG. 4D, an ion bombardment step with heavy ions 413 such as arsenic ions is performed on the polysilicon gate 410 surface, wherein the dosage of the arsenic ions is about 1E14–1E15 ions/cm$^2$ and the energy of the arsenic ions is about 20–40 KeV. The ion bombardment step damages the gate 410 surface to form an amorphous silicon layer. The grain size of the amorphous silicon layer are smaller than those of the gate 410. at its surface, the number of nucleation sites is increased. The grains boundary 406 is used as a barrier layer; the probability of the arsenic ions 413 passing through the second polysilicon layer 408a into the first polysilicon layer 404a is reduced. The grains boundary 406 can prevent the arsenic ions 413 from passing through the second polysilicon layer 408a and the first polysilicon layer 404a into the substrate 400 while performing the pre-amorphization implant process. Therefore, subthreshold current is not increased and the subthreshold kink side-effect is avoided.

Figure 4E:
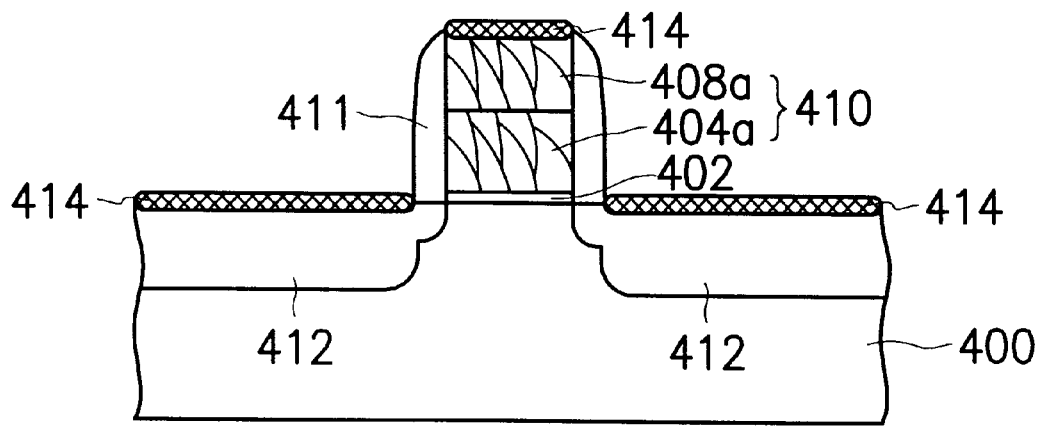

Referring to FIG. 4E, conformal a metallic layer (not shown) is deposited over the substrate 400 by, for example, sputtering. A portion of the metallic layer reacts with the silicon of the gate 410 and the source/drain region 412 to form a silicide layer 414 by rapid thermal processing (RTP), for example. Then, the unreacted metallic layer is removed, for example, by wet etching.

FIGS. 5A through 5D are schematic, cross-sectional views showing the progression of the manufacturing steps for a polysilicon gate and a self-aligned silicide in accordance with the third preferred embodiment of the present invention.

Figure 5A:
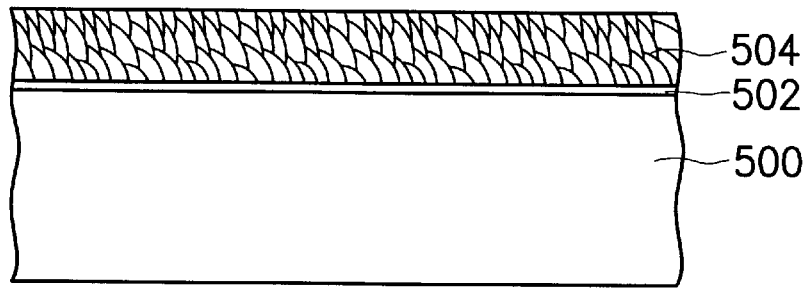
FIGS. 5A through 5D are schematic, cross-sectional views showing the progression of the manufacturing steps for a polysilicon gate and a self-aligned silicide in accordance with the third preferred embodiment of the present invention.

Referring to FIG. 5A, a gate oxide layer 502 is formed, for example, by thermal oxidation on a substrate 500. The thickness of the gate oxide layer 502 is about 30–60 Å. A polysilicon layer 504 is formed, for example, by chemical vapor deposition (CVD) on the gate oxide layer 502 at a temperature of about 600–700° C. and a pressure around 1–5 torr. The grain of the polysilicon layer 504 formed under the conditions mentioned above is smaller than before. The thickness of the first polysilicon layer 504 is about 1400–2100 Å. The first polysilicon layer 504 is preferably doped with ions such as phosphorus or boron to increase the conductivity.

Figure 5B:
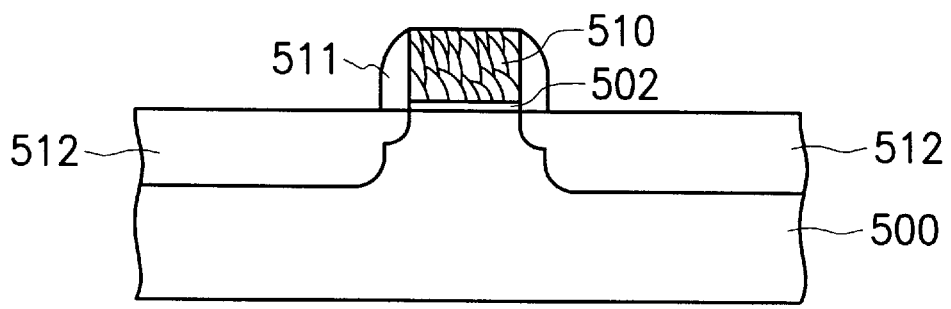

Referring to FIG. 5B, the polysilicon layer 504 is defined, for example, by photolithography and etching to form a gate 510. A spacer 511 is formed on the gate 510 sidewalls, source/drain regions 512 is formed in the substrate 500, and then a transistor according to the invention is complete. The technique of forming the transistor is not directly related to the invention and is well known to these skilled in the art, so that detailed description is omitted herein. In the following, a self-aligned silicide process is performed with the gate 510 formed in accordance with this preferred embodiment of the present invention.

Figure 5C:
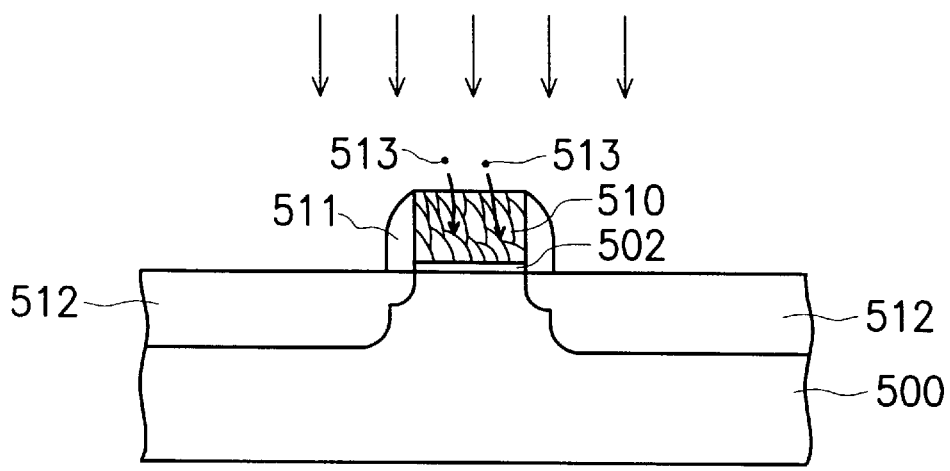

Referring to FIG. 5C, an ion bombardment step with heavy ions 513, such as arsenic ions, is performed on the polysilicon gate 510 surface, wherein the dosage of the arsenic ions is about 1E14–1E15 ions/cm$^2$ and the energy of the arsenic ions is about 20–40 KeV. The ion bombardment step damages the gate 510 surface to form an amorphous silicon layer. Since the size of nucleation site of the amorphous silicon layer is smaller than that of the gate 510 at its surface, the number of nucleation sites is increased. The polysilicon layer 504 is formed at a temperature of about 600–700° C. and a pressure of about 1–5 torr, so that the grain of the polysilicon layer 504 is smaller than before. As a result, a path of the arsenic ions 513 to the gate oxide layer 502 is longer due to the small grains of the polysilicon layer 504; the long pathway of the arsenic ions 513 can prevent the arsenic ions 513 from passing directly through the polysilicon layer 504 into the substrate 500 along the contact surface 510 between the poly grains. The polysilicon layer 504 formed under special conditions can prevent the arsenic ions 513 from passing through the polysilicon layer 504 into the substrate 500 while performing the pre-amorphization implant process. Therefore, subthreshold current is not increased and subthreshold kink side-effect is avoided.

Figure 5D:
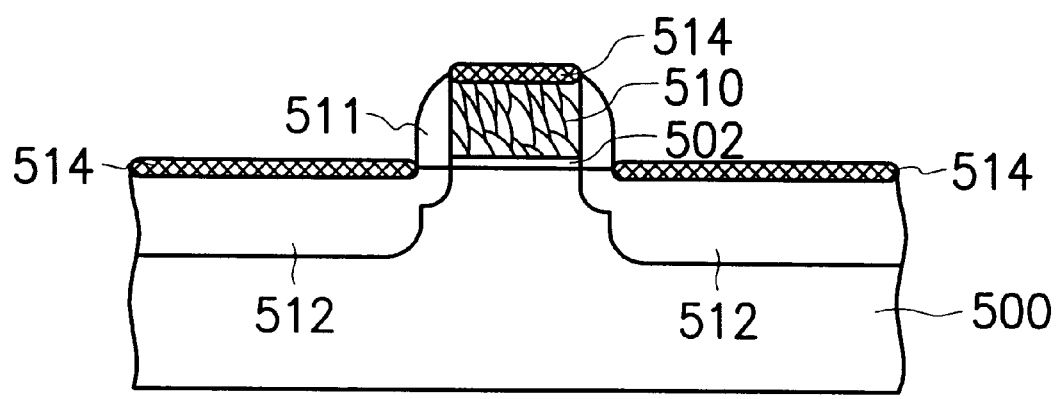

Referring to FIG. 5D, a metallic layer (not shown) is conformally deposited on the substrate 500 by, for example, sputtering. A portion of the metallic layer reacts with the silicon of the gate 510 and the source/drain region 512 to form a silicide layer 514 by rapid thermal processing (RTP), for example. Then, the unreacted metallic layer is removed, for example, by wet etching.

Figure 6:
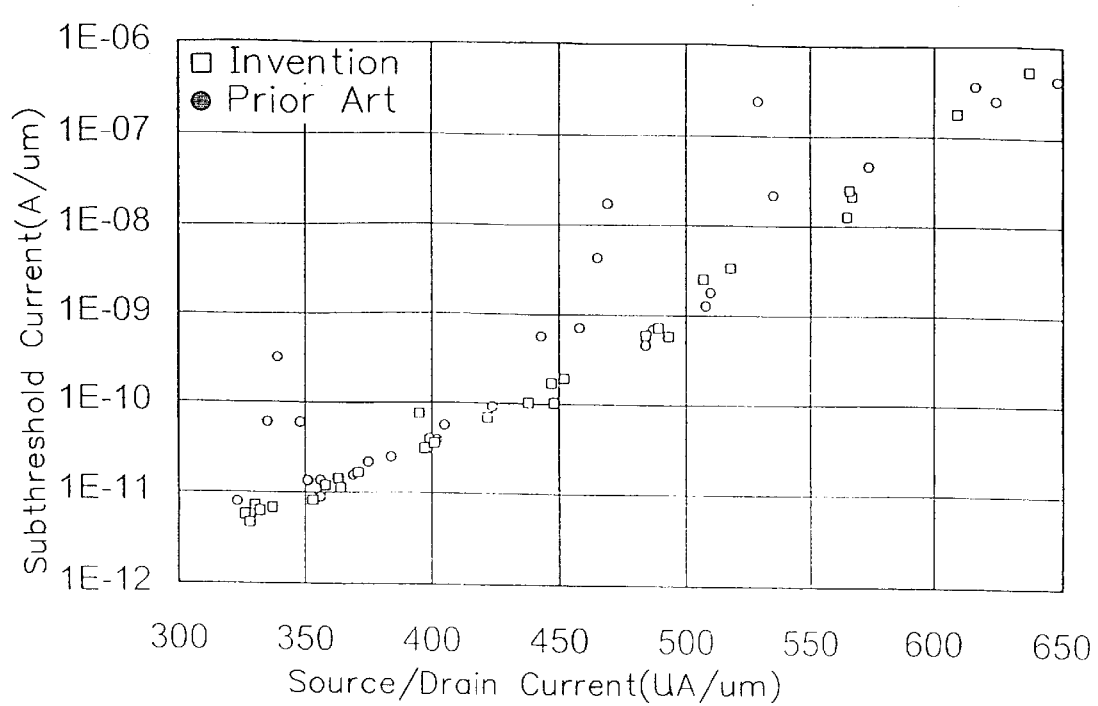
FIG. 6 shows the relationship between subthreshold current ($I_{off}$) and source/drain current ($I_{on}$)

FIG. 6 shows the relationship between subthreshold current ($I_{off}$) and source/drain current ($I_{on}$) which is obtained by testing transistors formed by the invention and the conventional process. As shown in FIG. 6, the X-coordinate indicates a source/drain current ($I_{on}$), which denotes measure of current between the source and drain when the transistor is switched to the ON state. The Y-coordinate indicates a subthreshold current ($I_{off}$), which denotes a measure of current between the source and drain when the transistor is switched to the OFF state. Square symbols (showing in FIG. 6) represent the testing results of transistors with different gate widths formed on a same chip according to the invention. Circular symbols (showing in FIG. 6) represent the testing results of transistors with different gate widths formed on a same chip in conventional method. The source/drain current ($I_{on}$) depends on the gate width of the transistor. As the gate width gradually widens, the source/drain current ($I_{on}$) becomes larger.

Referring to FIG. 6, the subthreshold currents ($I_{off}$) of the transistors formed by this invention are about 1E-10 to 5E-10 A/$\mu$m within a range of the source/drain current ($I_{on}$) about 425–475 $\mu$A/$\mu$m, and the subthreshold currents ($I_{off}$) of the transistors formed by conventional method are about 1E-10 to 1E-8 A/$\mu$m within the same range of the source/drain current ($I_{on}$). According to the results mentioned above, the subthreshold current is greatly reduced by applying the invention.

The invention prevents the heavy ions from passing through the polysilicon gate and the gate oxide layer into the substrate while performing a pre-amorphization implant process. The subthreshold kink side-effect is avoided. Additionally, the method applies to NMOS or PMOS, and it can also be applied to dual gate formation.

The invention also can prevent other ions, such as boron ions, from passing through the gate oxide layer into the substrate by diffusion. The boron ions easily penetrate through the gate oxide layer into the substrate because their diffusion coefficient is larger in an oxide layer. In the second preferred embodiment of the present invention, a grain boundary can reduce the probability of the boron ions diffusing into the gate oxide layer. In the third preferred embodiments of the present invention, a path to the gate oxide layer is longer due to the small grains of the polysilicon layer, so that the probability of the boron ions penetrating into the gate oxide layer is reduced.

Furthermore, the formation speed of the silicide layer at center of the gate is faster than the silicide layer formed in other positions. The metal diffuses down along the gap between polysilicon lattices to cause a spike phenomenon. In the invention, the oxide layer formed in the first preferred embodiment and the grain boundary formed in the second preferred embodiment are all used as a barrier layer to avoid the spike phenomenon.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming polysilicon gate, comprising the steps of:

providing a substrate;

forming a gate oxide layer on the substrate;

forming a first polysilicon layer on the gate oxide layer;

forming an oxide layer on the first polysilicon layer;

forming a second polysilicon layer on the oxide layer which is thinner than the first polysilicon layer; and patterning the second polysilicon layer, the oxide layer and the first polysilicon layer to form a polysilicon gate;

performing a pre-amorphization implant process on the polysilicon gate.

2. The method of claim 1, wherein a thickness of the first polysilicon layer is about 800–1200 Å.

3. The method of claim 1, wherein a thickness of the second polysilicon layer is about 500–900 Å.

4. The method of claim 1, wherein a thickness of the oxide layer is about 10–50 Å.

5. The method of claim 1, wherein the step of forming the oxide layer includes using thermal oxidation.

6. The method of claim 1, wherein the step of performing the pre-amorphization implant comprises implanting ions on a surface of the polysilicon gate.

7. The method of claim 6, wherein the ions comprise arsenic ions, and are implanted with a density of about 1E14–1E15 ions/cm$^2$ and an energy of about 20–40 KeV.

* * * * *